United States Patent [19]

Hsieh

[11] Patent Number: 5,153,142
[45] Date of Patent: Oct. 6, 1992

[54] METHOD FOR FABRICATING AN INDIUM TIN OXIDE ELECTRODE FOR A THIN FILM TRANSISTOR

[75] Inventor: In-Cha Hsieh, Kao-Hsung Hsien, Taiwan

[73] Assignee: Industrial Technology Research Institute, Chutung, Taiwan

[21] Appl. No.: 576,959

[22] Filed: Sep. 4, 1990

[51] Int. Cl.⁵ .................. H01L 21/28; H01L 21/336
[52] U.S. Cl. ........................ 437/40; 437/21; 437/181
[58] Field of Search ............. 437/40, 41, 101, 233, 437/21, 181; 357/23.7, 2, 4

[56] References Cited

U.S. PATENT DOCUMENTS

| | | | |
|---|---|---|---|
| 4,313,809 | 2/1982 | Benyon, Jr. et al. | 357/23.7 |
| 4,353,777 | 10/1982 | Jacob | 156/643 |
| 4,399,015 | 8/1983 | Endo et al. | 204/192 |
| 4,697,331 | 10/1987 | Boulitrop | 437/82 |
| 4,753,896 | 6/1988 | Matloubian | 357/23.7 |
| 4,755,482 | 7/1988 | Nagakubo | 357/23.7 |
| 4,821,092 | 4/1989 | Noguchi | 357/23.7 |
| 4,857,907 | 8/1989 | Koden | 357/23.7 |
| 4,906,587 | 3/1990 | Blake | 437/41 |
| 5,003,356 | 3/1991 | Wakai et al. | 357/23.7 |
| 5,036,370 | 7/1991 | Miyago et al. | 357/23.7 |
| 5,041,888 | 8/1991 | Possin et al. | 357/23.7 |
| 5,051,800 | 9/1991 | Shoji et al. | 357/23.7 |
| 5,054,887 | 10/1991 | Kato et al. | 357/23.7 |
| 5,060,036 | 10/1991 | Choi | 357/23.7 |

FOREIGN PATENT DOCUMENTS

| | | | |
|---|---|---|---|
| 0061183 | 4/1984 | Japan | 437/41 |
| 0219824 | 9/1989 | Japan | 357/23.7 |

Primary Examiner—Mary Wilczewski
Attorney, Agent, or Firm—George O. Saile

[57] ABSTRACT

A method and resulting structure is described for fabricating a thin film transistor which very effectively uses ITO as its transparent electrode. The method begins by providing a suitable substrate and forming thereover a polysilicon layer. A gate insulator layer is formed upon the polysilicon layer. A gate electrode layer is formed over the gate insulator layer. The gate electrode and gate insulator layers are then patterned to leave the desired gate insulator and gate electrode for the thin film transistor. An insulating layer is formed over the top surface of the structure. The isolating layer is patterned to provide openings to the designated source/drain regions of the thin film transistor. A conductive layer is deposited to make electrical contact to the source/drain regions of the thin film transistor. A silicon nitride passivation layer is formed over the conductive layer. The silicon nitride passivation layer is patterned to leave portions of the conductive layer open. The indium tin oxide (ITO) layer is deposited over the open portions of the conductive layer. The advantages of the process are to avoid the etching of the aluminium layer by the ITO etching process, avoid the ITO damage by the plasma enhanced silicon nitride process, and the solution of the poor adhesion between aluminium to ITO.

15 Claims, 4 Drawing Sheets

METHOD FOR FABRICATING AN INDIUM TIN OXIDE ELECTRODE FOR A THIN FILM TRANSISTOR

BACKGROUND OF THE INVENTION (1) Field of the Invention

The invention to a method of fabricating a transparent electrode, such as indium tin oxide for a thin film transistor.

(2) Description of the Prior Art

The indium tin oxide film, which is generally identified as ITO is composed of indium oxide and tin oxide. There are variations in the composition in regard to the completeness of the oxidation of the indium and tin plus the particular proportions of indium and tin oxide in the film. The principal methods of forming the ITO film is by sputtering either D.C. or R.F. The film may be deposited by simply sputtering a target of the desired composition or it may be deposited by a reactive sputtering technique wherein indium and tin from the target are reacted with oxygen in the ambient of the chamber. The Y. Endo et al U.S. Pat. No. 4,399,015 describes these types of deposition techniques.

The formation of thin film transistors require the use of various metals and insulators layers. ITO is a very desirable conductive layer in thin film transistors (TFT), because of its low resistivity and high transparency. ITO is preferably used for the pixel electrode of a LCD, because of its low resistivity and high transparency. Usually, the ITO is used together with a TFT. In this way, we can control the on and off of the LCD pixel by switching the TFT which is connected with the pixel electrode (ITO). Other materials that may also be used advantageously are, for example polysilicon, silicon oxide, aluminium with or without a silicon dopant, silicon nitride and the like.

A major drawback of ITO use is its processing relationship with these other materials. These problems stem in the most part from the difficulty of etching ITO and the difficulty for some materials to adhere to ITO. Some workers have even chosen to form an incomplete oxidized ITO which is then in turn etched and then annealed to fully oxidize the ITO as described by F. Boulitrop et al in U.S. Pat. No. 4,697,331. Additionally there can be processing of other materials which can damage the ITO itself. For example, since ITO is in a totally oxidized state, it is difficult to etch with the usual etchants. A very strong etchant is necessary, such as hydrochloric acid which has a detrimental effect upon other important layers in the thin film transistor structure. Also, there is very poor adhesion of aluminium to ITO (although the reverse, ITO to aluminium adhesion is satisfactory). The deposition of silicon nitride by plasma enhanced reactor can cause damage to the ITO.

It is therefore, an important object of this invention to provide a method for fabricating a thin film transistor LCD which uses ITO in the proper sequence to overcome the various problems associated with this material.

SUMMARY OF THE INVENTION

In accordance with the present invention, a method is described for fabricating a thin film transistor LCD which very effectively uses ITO as its transparent electrode. The method begins by providing a suitable substrate and forming thereover a polysilicon layer. A gate insulator layer is formed upon the polysilicon layer. A gate electrode layer is formed over the gate insulator layer. The gate electrode and gate insulator layers are then patterned to leave the desired gate insulator and gate electrode for the thin film transistor. An insulating layer is formed over the top surface of the structure. The isolating layer is patterned to provide openings to the designated source/drain regions of the thin film transistor. A conductive layer is deposited to make electrical contact to the source/drain regions of the thin film transistor. A silicon nitride passivation layer is formed over the conductive layer. The silicon nitride passivation layer is patterned to leave portions of the conductive layer open. The indium tin oxide (ITO) layer is deposited over the open portions of the conductive layer. The gate electrode and source/drain elements are connected to form the thin film transistor.

Also in accordance with the present invention, there is the resulting thin film transistor structure that is formed by the method described above. A polysilicon layer is located upon the substrate. A gate insulator and gate electrode is positioned at the desired location of the polysilicon layer. An isolating layer covers the polysilicon layer and gate electrode with openings therein to the designated source/drain regions of the polysilicon layer, adjacent to said gate insulator and gate electrode. A conductive layer makes electrical contact to the source/drain regions. A silicon nitride passivation layer covers the surfaces of the conductive layer with portions thereof open for contact to the indium tin oxide (ITO) layer. The gate electrode and source/drain elements are connected to form the thin film transistor.

DESCRIPTION OF THE PREFERRED EMBODIMENTS

Figure 1:
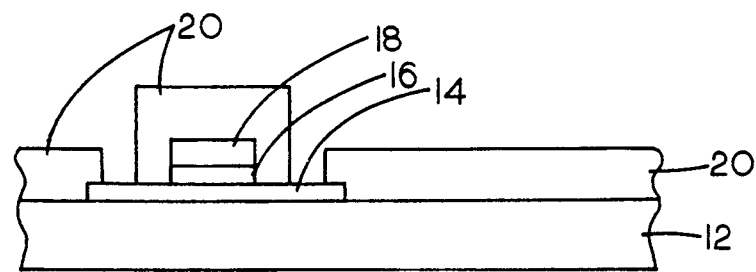
FIG. 1 through FIG. 4 schematically illustrate a first Prior Art method for forming a thin film transistor that has certain disadvantages.
Figure 2:
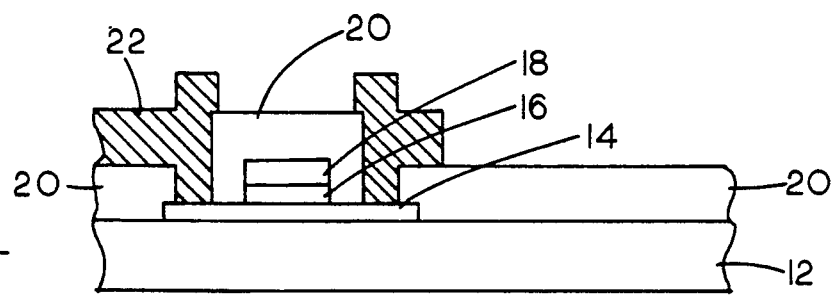

In an effort to point up the importance of the sequence of the steps of the present invention to fabricate a thin film transistor using the ITO transparent electrode, we wish to show the first and second methods of the Prior Art as seen in the FIGS. 1 through 4 and FIGS. 5 through 8, respectively.

Referring now more particularly to FIGS. 1 through 4 Prior Art embodiment, where there is shown a substrate 12 which is composed of a silicate material. The substrate is quartz for a high temperature process and a glass material for a low temperature process.

The first steps involve the formation of the polysilicon layer 14. The polysilicon layer 14 is formed by LPCVD with silane flow of 90 sccm. at 560° C., and a pressure of 160 mtorr. for 30 minutes. This polysilicon layer 14 is appropriately doped and patterned. After patterning this gate electrode and gate insulator by conventional lithography and etching techniques, this polysilicon is doped with the gate electrode as the self-align mask. The polysilicon layer 14 has a thickness of between about 0.08 to 0.1 micrometers and preferably about 0.1 micrometers.

The gate insulator layer 16 is formed by either chemical vapor deposition or thermal oxidation. Preferably it is formed by thermal oxidation at about 1000° C. in dry oxygen ambient for 130 minutes. The gate insulator layer 16 is preferably silicon dioxide and has a thickness of between about 0.1 to 0.15 micrometers and preferably about 0.1 micrometers.

The gate electrode 18 is now formed over the gate insulator 16. It is preferably composed of polysilicon deposited by LPCVD with silane flow of 90 sccm. at 220 mtorr. for about 50 minutes. It has a thickness of between about 0.4 to 0.45 micrometers and preferably about 0.45 micrometers. The gate electrode could also be silicide or polycide of transition metals.

The gate electrode 18 and gate insulator layer 16 are now patterned together using standard lithography and etching techniques as are known in the art. A lithographic mask is formed over the region of the layers to be preserved. A plasma or reactive ion etching process is used to remove the unwanted portions of layers 16 and 18. The gate electrode 18 is etched by reactive ion etching with Freon 12, i.e. $CCl_2F_2$, at 14 sccm. and argon at 30 sccm. at 280 mtorr. The gate insulator layer 16 is etched by a 20 to 1 BOE solution ($HF:H_2O=1:20$) at 25° C.

An isolating layer 20 is blanket deposited over the top surface of the structure. This layer 20 is formed by atmospheric pressure chemical vapor deposition (APCVD) with silane and oxygen at about 420° C. The isolating layer 20 is preferably composed of phosphosilicate glass, but could be alternatively formed of undoped low temperature silicon dioxide, plasma deposited silicon nitride or TEOS silicon dioxide. The thickness of the layer 20 is between about 0.6 to 1.0 micrometers. It is preferably about 0.8 micrometers. The layer 20 has openings formed therein by conventional lithography and etching techniques. The openings are formed to the regions of the polysilicon layer 14 which are designated to be the source/drain regions of the thin film transistor. The result of this process is shown in FIG. 1.

The metal layer 22 which is preferably composed of aluminium or aluminium-silicon is deposited preferably by sputtering using, for example a Varian 3190 sputtering machine using argon as the ion beam and aluminium or aluminium-silicon as the target. The layer 22 is between about 0.5 to 1.0 micrometers in thickness and preferably about 0.6 micrometers in thickness. The metal layer 22 is patterned by conventional lithography and etching techniques to form the FIG. 2 structure. The aluminium is etched by a solution of sulfuric acid and nitric acid.

The transparent indium tin oxide (ITO) layer 24 is now deposited preferably by reactive ion sputtering of the indium and tin particles in an oxygen ambient. The thickness of the resulting ITO layer 24 is between about 0.1 to 0.15 micrometers and preferably about 0.1 micrometers.

Figure 3:
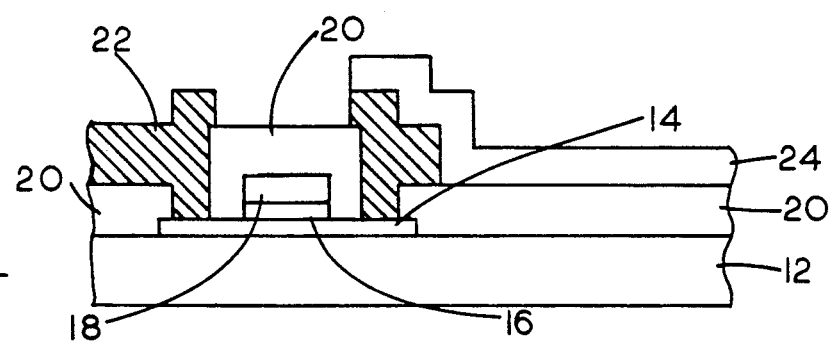

The major problem in this process is now encountered in the patterning of the ITO layer 24. To pattern the ITO layer a very strong etchant is necessary. The etchant used is hydrochloric acid with concentration of $HCl:HNO_3:H_2O = 6000$ cc:360 cc:6000 cc. The etching of the ITO layer 24 results in the attack of the underlying aluminium or aluminium-silicon metal layer 22 to the point of badly affecting yield and device performance. The theoretical result of the step is shown in FIG. 3.

Figure 4:
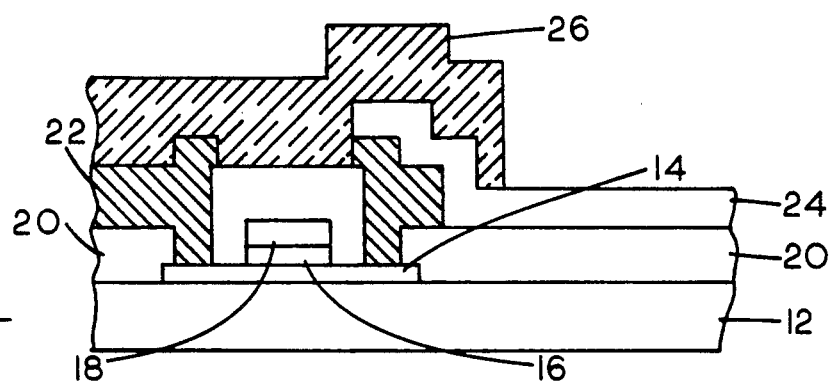

The next step of the process is shown in FIG. 4 wherein the passivation layer 26 is formed and patterned. The preferred passivation layer 26 is plasma enhanced chemical vapor deposited silicon nitride using silane and ammonia at 1.8 torr and 300° C. The thickness of the silicon nitride layer 26 is between about 0.5 to 1.0 micrometers and preferably about 0.8 micrometers. The patterning of the layer 26 is done by conventional lithography and etching techniques. The etchant for silicon nitride that is preferred is $CHF_3$ by reactive ion etching.

The theoretical result of this process is given in FIG. 4. However, as suggested above the result of this process is unsatisfactory, because of the problem of the ITO etchant that will also etch the aluminium metallurgy.

Figure 5:
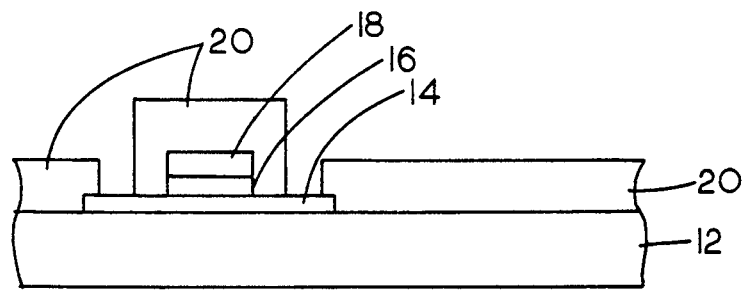
FIG. 5 through FIG. 8 schematically illustrate a second Prior Art method for forming a thin film transistor that has certain other disadvantages.

Referring now to the second Prior Art embodiment in FIGS. 5 through 8, the first series of processes that form the FIG. 5 are identical to that of the processes which were used in the first Prior Art embodiment of FIG. 1. The same numbers are used for like elements that were formed by similar processes.

Figure 6:
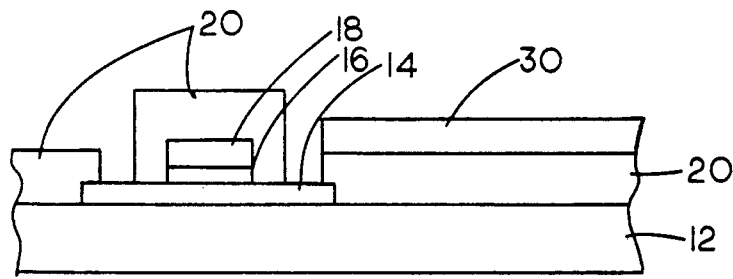

A major difference in the sequence involves the deposition of the indium tin oxide (ITO) layer 30 by the sputtering technique as described in the first embodiment at this point in the process and then patterning the layer 30 by conventional lithography and etching to obtain the FIG. 6 structure.

Figure 7:
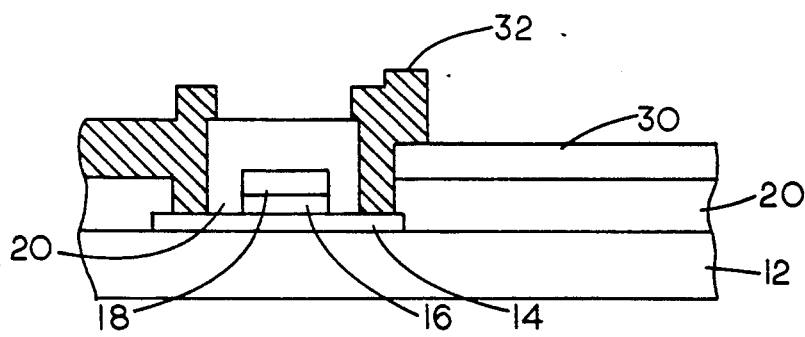

The metal layer 32 is now deposited as described in the first embodiment onto the top surface and patterned by lithography and etching to obtain the FIG. 7 structure. The metal layer contacts the source and drain regions of the polysilicon layer 14. Here is one major problem with this particular embodiment. The adhesion of the metal aluminium or alumunium-silicon to ITO is poor and will adversely affect yields.

Figure 8:
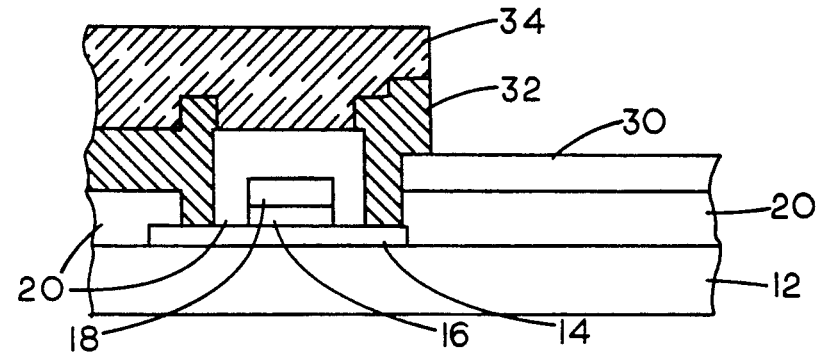

The next step of the process is to form the passivation layer 34 over the metal layer 32. The preferred passivation layer 34 is silicon nitride. The silicon nitride is deposited by plasma enhanced chemical vapor deposition involving the gases silane and ammonia at a temperature of 300° C. and pressure of 1.8 torr. This process step causes a second major problem is yield due to the damage to the ITO layer 30 during the deposition of the silicon nitride. The FIG. 8 shows the completed process embodiment after the silicon nitride layer 34 has been patterned using lithography and etching.

The FIG. 5 through 8 embodiment is unsatisfactory from a yield point of view because of the poor adhesion of the aluminium or aluminium-silicon layer to the ITO layer and the damage to the ITO layer during the plasma enhanced chemical vapor deposition of the silicon nitride passivation layer.

Figure 9:
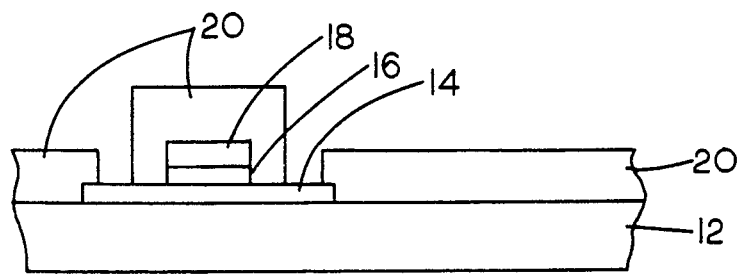
FIG. 9 through 12 schematically illustrate a method for forming a thin film transistor according to the present invention which do not have the disadvantages of the Prior Art.
Figure 10:
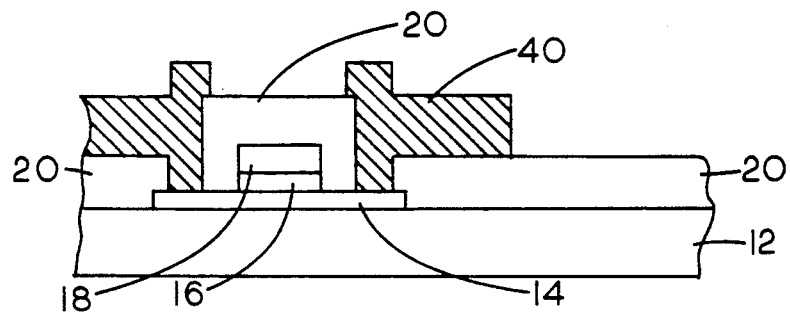
Figure 11:
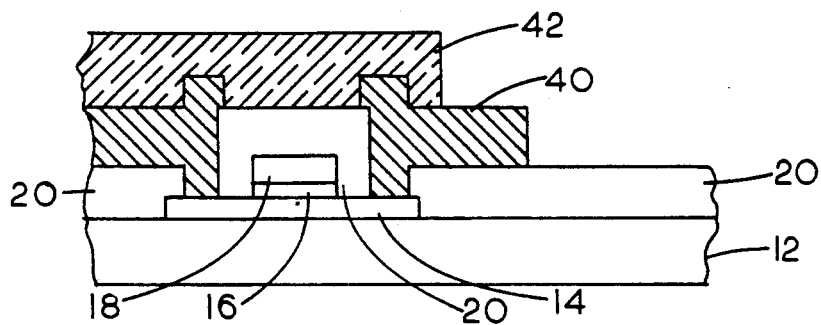
Figure 12:
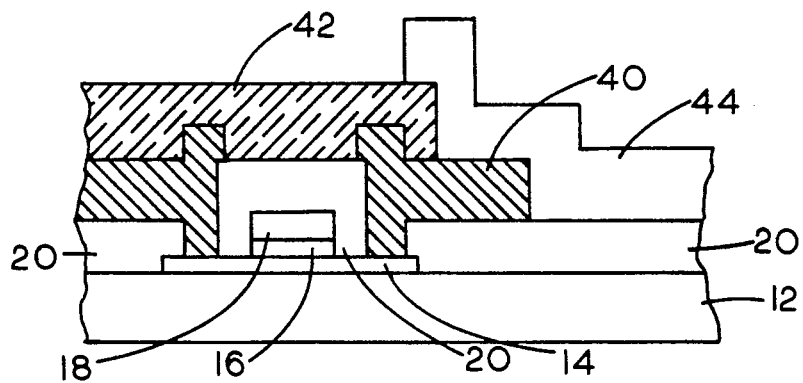

Referring now to the new inventions shown in FIGS. 9 through 12, the first series of processes that form the FIG. 9 are identical to that of the processes which were used in the first Prior Art embodiment of FIG. 1. Also, the metal layer 40, which is preferably aluminium or aluminium-silicon is formed as in the sequence of FIG. 2. However, the shape of the patterned metal layer 40 is slightly larger, for the proper contact to the subsequent deposited ITO layer 44 as can be seen with reference to FIGS. 10 and 11, than that of the FIG. 1 embodiment.

The same numbers are used for like elements that were formed by similar processes.

The process sequence continues with the deposition of passivation layer 42 of plasma enhanced chemical vapor deposited silicon nitride by the method described above. The layer is patterned by lithography and etching to form the FIG. 11 structure.

The final step in the process of forming the thin film transistor of the present invention involves the deposition of the ITO layer 44. This layer is sputtered according to the process described in the first Prior Art embodiment. It should be noted that we have found that there is not an adhesion problem of the ITO layer onto the aluminium or aluminium-silicon. The problem only arises when the aluminium or aluminium-silicon is attempted to be deposited upon the ITO layer. The layer 44 is patterned by lithography and etching to form the completed transistor of FIG. 12.

Figure 13:
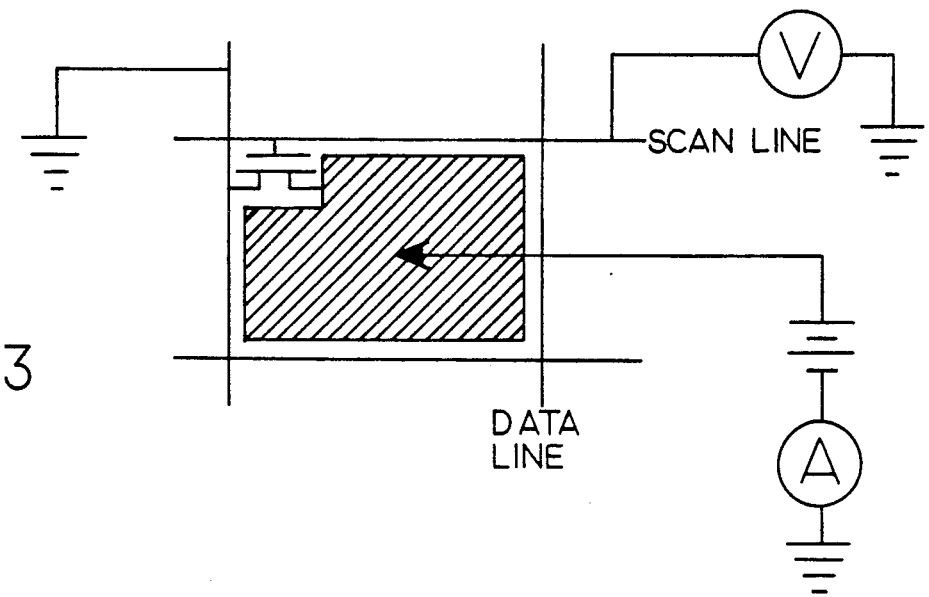
FIG. 13 is an arrangement to measure the device characteristics of an active matrix LCD.

When depositing and patterning the gate electrode, the scan line in FIG. 13, which provides the connection of the gate electrode to outside power source, is also deposited and patterned with the same material at the same time. There is no need for further connection to be made at this level. Similarly, the drain electrode is connected when the aluminium is deposited and patterned as the drain electrode and data line in the same step. The source, which is connected to the ITO pixel electrode, is connected simultaneously when the ITO layer is deposited over the open portion of the conductive layer.

The advantages of the new process sequence of the present invention to form a thin film transistor as shown in FIGS. 9 through 12 and as described above are (1) the avoidance of the aluminium or aluminium-silicon etching by the ITO etching process, (2) the avoidance of ITO damage by the plasma enhanced silicon nitride deposition process, and (3) the solution of the poor adhesion between aluminium or aluminium-silicon layer to ITO.

Figure 14:
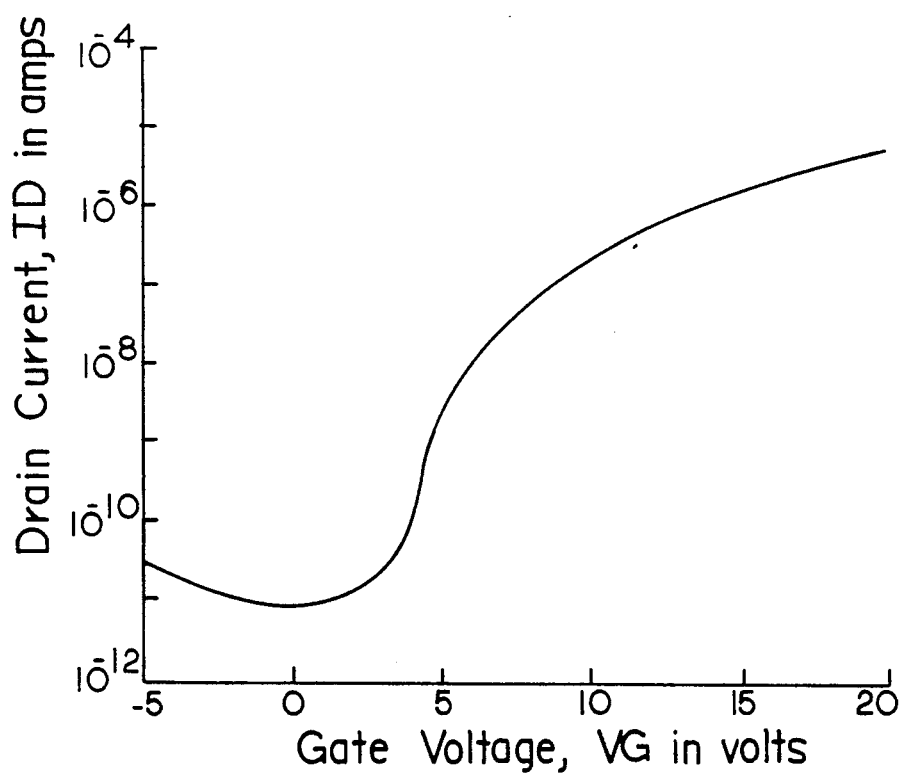
FIG. 14 shows the transfer characteristics of the polysilicon thin film transistor of the present invention.

The FIGS. 9 through 12 process sequence was used to make an active matrix liquid crystal display (LCD) arrangement shown in FIG. 13 to measure the pixel device characteristics to confirm the performance of the new process and resulting product. A voltage is added to the gate (scan line) from −5 volts to 20 volts with a step of 0.5 volts. A +5 volt voltage is added to the drain (pixel electrode ITO) with the source (data Line) being grounded. Then the drain current is shown in an exponential curve of ten. The drain current-gate voltage (ID-VG) transfer characteristic curve is shown in FIG. 14 where ID is almost linearly proportional to VG as VG is increased from 0 to near $1 \times 10^5$. This proves that the performance of the pixel device manufactured by the new process is very acceptable.

While the invention has been particularly shown and described with reference to the preferred embodiments thereof, it will be understood by those skilled in the art that various changes in form and details may be made without departing from the spirit and scope of the invention.

What is claimed is:

1. The method for fabricating a thin film transistor comprising:
   providing a substrate;
   forming and patterning a polysilicon layer upon said substrate;
   forming a gate insulator layer upon said polysilicon layer;
   forming a gate electrode layer over said gate insulator layer;
   patterning said gate electrode and gate insulator layers to leave the desired gate insulator and gate electrode for said thin film transistor;
   forming an isolating layer over the top surface of the structure;
   patterning said isolating layer to provide openings to the source/drain regions of said thin film transistor;
   depositing an aluminum conductive layer to make electrical contact to said source/drain regions of said thin film transistor;
   patterning said conductive layer to include contact regions for subsequent electrical contact;
   forming a silicon nitride passivation layer over the said conductive layer;
   patterning said silicon nitride passivation layer to leave said contact regions of said conductive layer open;
   depositing an indium tin oxide layer over said contact regions of said conductive layer; and patterning said indium tin oxide layer;
   connecting said gate electrode and said source/drain elements to form said thin film transistor.

2. The method of claim 1 wherein the said substrate is a glass substrate which is capable of withstanding temperature required for subsequent processing.

3. The method of claim 1 wherein the said polysilicon layer is doped using the said patterned gate electrode and gate insulator as a self-align mask.

4. The method of claim 1 wherein the said gate insulator is silicon oxide and has a thickness of between about 100 to 150 nanometers.

5. The method of claim 1 wherein the said gate electrode is a second layer of polysilicon and has a thickness of between about 400 to 450 nanometers and a doping concentration greater than about $1 \times 10^{22}$ ions per cubic cm.

6. The method of claim 1 wherein the said isolating layer is composed of phosphosilicate glass and has a thickness of between about 500 to 1000 nanometers.

7. The method of claim 1 wherein the said conductive layer is aluminium-silicon alloy.

8. The method of claim 1 wherein the said silicon nitride layer is formed by a plasma enhanced chemical vapor deposition process and has a thickness of between about 500 to 1000 nanometers.

9. The method of claim 1 wherein the polysilicon layer is N+ doped, the thickness of said isolating layer is between about 500 to 1000 nanometers, and the thickness of said silicon nitride layer is between about 500 to 1000 nanometers.

10. The method of claim 1 wherein the said indium tin oxide layer is formed by reactive sputtering of indium and tin particles in an oxygen reactive ion sputtering ambient.

11. The method of claim 10 wherein the said indium tin oxide overlaps only the said isolating layer, the said silicon nitride layer and the said conductive layer.

12. The method for fabricating a thin film transistor comprising:
   providing a substrate;
   forming and patterning a polysilicon layer upon said substrate;
   forming a gate insulator layer upon said polysilicon layer;
   forming a polysilicon gate electrode layer over said gate insulator layer;

patterning said gate electrode and gate insulator layers to leave the desired gate insulator and gate electrode for said thin film transistor;

forming an phosphosilicate glass isolating layer over the top surface of the structure;

patterning said isolating layer to provide openings to the source/drain regions in said polysilicon layer of said thin film transistor;

depositing an aluminium conductive layer to make electrical contact to said source/drain regions of said thin film transistor;

patterning said conductive layer to include contact regions for subsequent electrical contact;

forming a silicon nitride passivation layer by a plasma enhanced chemical vapor deposition process over the said conductive layer;

patterning said silicon nitride passivation layer to leave said contact regions of said conductive layer open;

depositing an indium tin oxide layer over said contact regions of said conductive layer;

patterning said indium tin oxide layer so that said indium tin oxide overlaps only the said isolating layer, the said silicon nitride layer and the said conductive layer; and connecting said gate electrode and said source/drain elements to form said thin film transistor.

13. The method of claim 12 wherein the polysilicon layer is N+ doped, the thickness of said isolating layer is between about 500 to 1000 nanometers, and the thickness of said silicon nitride layer is between about 500 to 1000 nanometers.

14. The method of claim 12 wherein the said aluminium conductive layer has a small amount of silicon dispersed therein.

15. The method of claim 1 wherein and further comprising at the time of said forming and patterning said gate electrode, a scan line is also formed; said scan line connects said gate electrode to a power source; at the time of said depositing and patterning said drain regions connections with said conductive layer, a data line in also formed; said data line is connected to said drain regions; and the sources are connected with and through said conductive layer to said indium tin oxide pixel electrode when said indium tin oxide layer is deposited over said conductive layer.

* * * * *